(12) United States Patent
Roy et al.

(10) Patent No.: US 11,796,606 B2
(45) Date of Patent: Oct. 24, 2023

(54) PIN-LEAKAGE COMPENSATION SCHEME FOR EXTERNAL RESISTOR-BASED OSCILLATORS

(71) Applicant: TEXAS INSTRUMENTS INCORPORATED, Dallas, TX (US)

(72) Inventors: Aniruddha Roy, Bangalore (IN); Nitin Agarwal, Bangalore (IN); Preetham Narayana Reddy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/509,836

(22) Filed: Oct. 25, 2021

(65) Prior Publication Data

US 2022/0334196 A1      Oct. 20, 2022

(30) Foreign Application Priority Data

Apr. 20, 2021    (IN) .............................. 202141018273

(51) Int. Cl.
| | | |
|---|---|---|
| *G01R 31/52* | (2020.01) | |
| *H03B 5/12* | (2006.01) | |
| *H03K 3/0231* | (2006.01) | |
| *H03K 4/502* | (2006.01) | |

(52) U.S. Cl.
CPC ........... *G01R 31/52* (2020.01); *H03B 5/1203* (2013.01); *H03K 3/0231* (2013.01); *H03K 4/502* (2013.01)

(58) Field of Classification Search
CPC .... H03B 2200/0038; H03B 5/20; H03B 5/24; H03B 2202/04; H03B 2202/08; H03B 2202/088; H03K 3/0231; H03K 4/501; H03K 4/502; H03K 3/011
See application file for complete search history.

(56) References Cited

U.S. PATENT DOCUMENTS

| | | |
|---|---|---|
| 6,020,792 A | 2/2000 | Das et al. |
| 7,034,627 B1 | 4/2006 | Kudari |
| 7,332,944 B2 | 2/2008 | Fujita et al. |

(Continued)

OTHER PUBLICATIONS

Non-Final Office Action dated Jun. 10, 2022, U.S. Appl. No. 17/509,706, filed Oct. 25, 2021, 12 pages.

(Continued)

*Primary Examiner* — Ryan Johnson
(74) *Attorney, Agent, or Firm* — Krista Y. Chan; Frank D. Cimino

(57) ABSTRACT

In an example, a system includes an oscillator circuit on a chip. The oscillator circuit includes a charging current generator including a current mirror and an amplifier, where the amplifier is coupled to a pin on the chip, and where the pin is adapted to be coupled to an external resistor, where the external resistor is external to the chip. The oscillator circuit also includes oscillator circuitry coupled to the charging current generator, where the oscillator circuitry includes a comparator, a phase generator, a first capacitor coupled to a first switch, and a second capacitor coupled to a second switch. The oscillator circuit includes leakage circuitry coupled to the current mirror, where the leakage circuitry is configured to draw a current from the current mirror proportional to a leakage current flowing through the external resistor from circuitry internal to the chip.

20 Claims, 4 Drawing Sheets

(56) References Cited

U.S. PATENT DOCUMENTS

| | | |
|---|---|---|
| 9,520,881 B1 | 12/2016 | Das et al. |
| 10,666,235 B1 | 5/2020 | Chou et al. |
| 11,329,606 B1 | 5/2022 | Cao et al. |
| 11,437,955 B1 | 9/2022 | Agarwal et al. |
| 2006/0097813 A1 | 5/2006 | Won |
| 2006/0126238 A1 | 6/2006 | Goudo |
| 2007/0146087 A1* | 6/2007 | Hwang .................. H03K 4/502 331/111 |
| 2007/0233912 A1 | 10/2007 | Piasecki et al. |
| 2008/0136492 A1* | 6/2008 | Hu ........................... H03L 7/08 327/362 |
| 2008/0180151 A1 | 7/2008 | Gong et al. |
| 2014/0062610 A1 | 3/2014 | Ito et al. |
| 2015/0214934 A1 | 7/2015 | Luan et al. |
| 2016/0254817 A1* | 9/2016 | Vahid Far ............. H03L 7/0802 327/157 |
| 2017/0104475 A1 | 4/2017 | Lam |
| 2017/0279454 A1 | 9/2017 | Li |
| 2019/0013779 A1 | 1/2019 | Jin et al. |
| 2019/0149140 A1* | 5/2019 | Han ........................ H03K 3/011 331/8 |
| 2019/0319611 A1 | 10/2019 | Sim et al. |
| 2020/0014372 A1 | 1/2020 | Narwal et al. |

OTHER PUBLICATIONS

Final Office Action dated Nov. 18, 2022, U.S. Appl. No. 17/509,706, filed Oct. 25, 2021, 9 pages.
Notice of Allowance dated Apr. 21, 2022, U.S. Appl. No. 17/510,032, filed Oct. 25, 2021, 9 pages.

* cited by examiner

PIN-LEAKAGE COMPENSATION SCHEME FOR EXTERNAL RESISTOR-BASED OSCILLATORS

CROSS-REFERENCE TO RELATED APPLICATIONS

The present application claims priority to Indian Provisional Patent Application No. 202141018273, which was filed Apr. 20, 2021, is titled "Pin-Leakage Compensation Scheme For Precision Ext-R Based Oscillators," and is hereby incorporated herein by reference in its entirety. The present application is related to U.S. application Ser. No. 17/509,706, filed concurrently herewith, which is titled "Enabling an External Resistor for an Oscillator," and which claims priority to India Provisional Patent Application No. 202141018551, which was filed Apr. 22, 2021. The present application is also related to U.S. application Ser. No. 17/510,032, filed concurrently herewith, which is titled "Switchover Schemes for Transition of Oscillator from Internal-Resistor to External-Resistor Mode," (now U.S. Pat. No. 11,437,955) and which claims priority to India Provisional Patent Application No. 202141035219, filed Aug. 5, 2021.

BACKGROUND

Oscillators generate clock signals for microcontrollers and other electronic devices. Oscillators produce a repeating and alternating waveform that may be used for a variety of applications. Oscillators may be located within an electronic chip, with some components on-chip and some components off-chip. The accuracy of the oscillator may vary based on the structure of the oscillator and the components that make up the oscillator.

SUMMARY

In accordance with at least one example of the disclosure, a system includes an oscillator circuit on a chip. The oscillator circuit includes a charging current generator including a current mirror and an amplifier, where the amplifier is coupled to a pin on the chip, and where the pin is adapted to be coupled to circuitry internal to the chip. The oscillator circuit includes oscillator circuitry coupled to the charging current generator, where the oscillator circuitry includes a comparator, a phase generator, a first capacitor coupled to a first switch, and a second capacitor coupled to a second switch. The oscillator circuit includes leakage circuitry coupled to the current mirror, where the leakage circuitry is configured to draw a current from the current mirror proportional to a leakage current of the circuitry internal to the chip.

In accordance with at least one example of the disclosure, a system includes an oscillator circuit on a chip. The oscillator circuit includes a charging current generator including a current mirror and an amplifier, where the amplifier is coupled to a pin on the chip, and where the pin is adapted to be coupled to an external resistor, where the external resistor is external to the chip. The oscillator circuit also includes oscillator circuitry coupled to the charging current generator, where the oscillator circuitry includes a comparator, a phase generator, a first capacitor coupled to a first switch, and a second capacitor coupled to a second switch. The oscillator circuit includes leakage circuitry coupled to the current mirror, where the leakage circuitry is configured to draw a current from the current mirror proportional to a leakage current flowing through the external resistor from circuitry internal to the chip.

In accordance with at least one example of the disclosure, a method includes coupling a pin of an oscillator chip to an external resistor. The method also includes generating a current for an oscillator, where the current is generated with an amplifier coupled to the external resistor and coupled to a current mirror. The method includes adjusting the current for the oscillator with leakage circuitry, where the leakage circuitry is configured to adjust the current to compensate for a leakage current through the external resistor.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
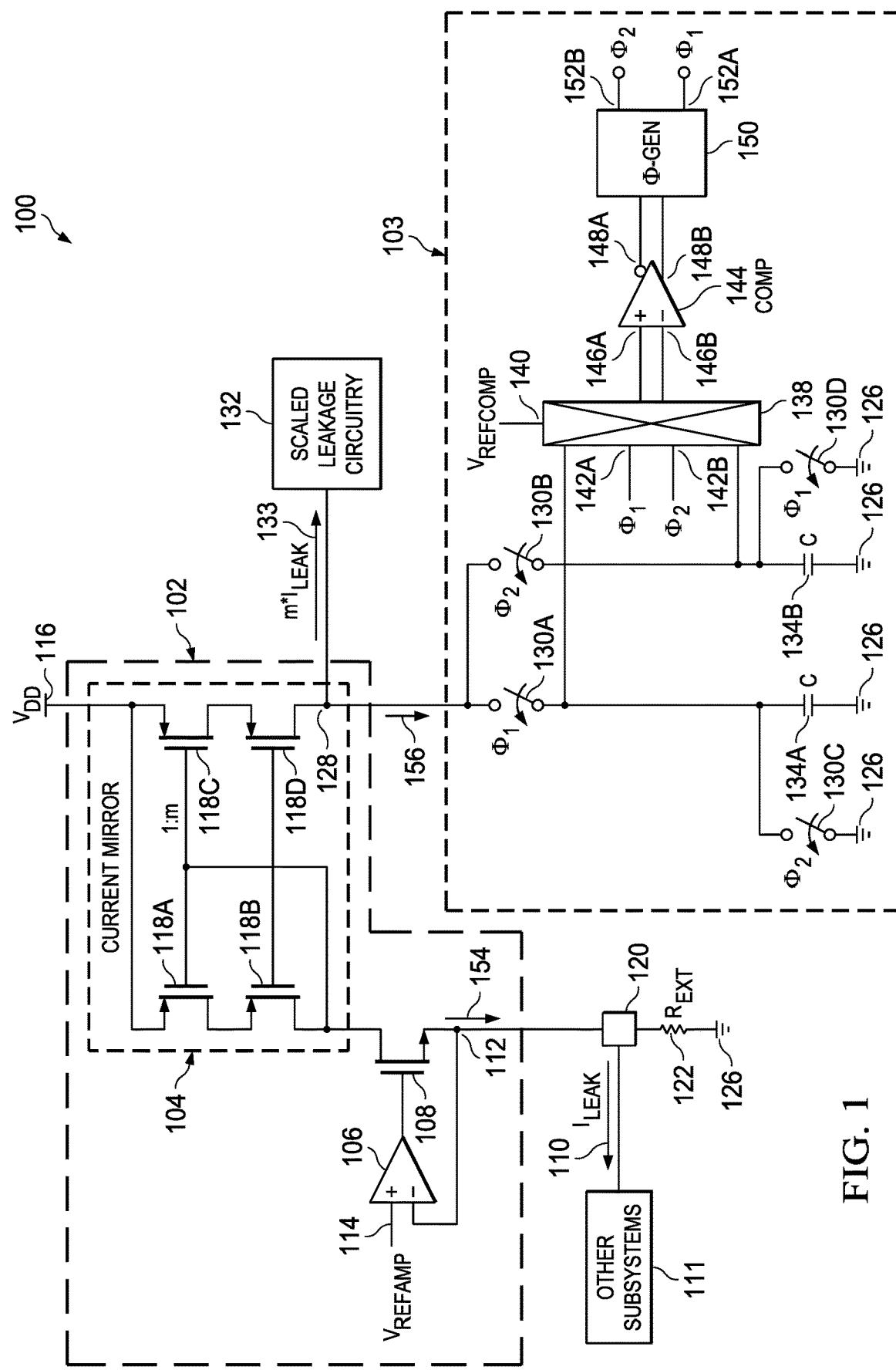
FIG. 1 is a circuit diagram of a pin-leakage compensation system for an oscillator with an external resistor in accordance with various examples.

Some oscillators may be produced that have circuit components located within an electronic chip (on-chip), while other oscillators have some circuit components located off the chip (off-chip). In examples herein, "off-chip" is synonymous with the term "external." Also, "on-chip" is synonymous with the term "internal." If an oscillator chip has on-chip resistor components, the resistor components may have a temperature-dependent non-linear variation. The resistor values may also drift over time. Due to these variations and other factors, an oscillator chip with on-chip resistor components may not be able to achieve accuracy of its frequency within 1% of a target frequency. An external resistor, coupled to the oscillator chip, may provide greater accuracy.

The external resistor is coupled to a pin on the oscillator chip. One cost-efficient option is to multiplex this pin with other functionalities, such as general purpose input/output (I/O), electrostatic discharge diodes, buffer outputs, etc. A multiplexer may select among one or more of these functionalities. When an external resistor is used, these other multiplexed functionalities may be disabled internally so the pin may be dedicated to the external resistor. However, this disabled multiplexed circuitry may have a temperature and voltage dependent leakage current that flows through the external resistor and affects the accuracy of the frequency of the oscillator across temperature. The leakage current alters the charging current produced by a charging current generator for the oscillator, and therefore the charging current provided to the oscillator circuitry path is different than designed.

If the multiplexed connections to circuitry that provides the other functionality are entirely on-chip, cut-off switches may be useful for cutting off leakage path. However, the switches may be large and may therefore also contribute to leakage. If the multiplexing of the applications occurs through multi-bonding on package (e.g., using separate bond-wires from silicon to package), it may not be possible to include cut-off switches anywhere in the device.

In examples herein, leakage compensation techniques are performed to cancel or compensate for the leakage current across voltage and temperature. The examples described herein are applicable to both the multiplexing case (e.g., using on-chip switches to select between different applications) and the multi-bonding case (using bond wires from silicon to package). In the examples described herein, a properly scaled copy of the leakage current is replicated with additional circuitry. This scaled leakage current is subtracted from or added to the oscillator circuitry path using the additional circuitry. Therefore, the current flowing to the oscillator switches is the designed current irrespective of any leakage. The additional circuitry may replicate the leakage path, along with a scaling factor that is applied to the leakage current throughout the circuit. In some examples, the scaling factor may be 1 (e.g., no scaling).

FIG. 1 is a circuit diagram of a pin-leakage compensation system 100 for an oscillator with an external resistor in accordance with various examples herein. System 100 includes a charging current generator 102 that generates charging current used by oscillator circuitry 103. Charging current generator 102 includes a current mirror 104, an amplifier 106, and a transistor 108. Leakage current LEAK 110 flows to other subsystems 111, which may be subsystems internal to a chip in an example. Node 112 and reference voltage node $V_{REFAMP}$ 114 are coupled to inputs of amplifier 106. Current mirror 104 is coupled to voltage node 116 and includes transistors 118A, 118B, 118C, and 118D (collectively, transistors 118). Oscillator circuitry 103 includes the components shown within the dashed box in this example. In some examples, other components may be included within oscillator circuitry 103. In other examples, some of the components shown within oscillator circuitry 103 may be outside of oscillator circuitry 103. In some examples herein, components within charging current generator 102 and oscillator circuitry 103 may be located inside an oscillator chip, while other components are external to the chip.

System 100 includes node 120, which is a pin of an oscillator chip that is configured to couple to external components. In this example, node 120 is coupled to external resistor $R_{EXT}$ 122 and other subsystems 111. In one example, the other subsystems 111 may include any circuitry or devices internal to the chip that leak current from node 120, which is a pin of the chip coupled to external resistor $R_{EXT}$ 122. External resistor $R_{EXT}$ 122 is coupled to ground 126.

System 100 also includes node 128, switches 130A, 130B, 130C, and 130D (collectively, switches 130), scaled leakage circuitry 132, scaled leakage current $m*I_{LEAK}$ 133, and capacitors 134A and 134B (collectively, capacitors 134). System 100 includes node 136A and node 136B, block 138, input node 140 (coupled to a voltage $V_{REFCOMP}$), input nodes 142A and 142B, and comparator 144. Comparator 144 includes first input 146A and second input 146B. Comparator 144 includes first output 148A and second output 148B. System 100 also includes phase generator 150, which has a first output 152A and a second output 152B. System 100 includes currents 154 and 156.

Charging current generator 102 provides a charging current to circuitry in system 100 that produces an oscillating waveform. As described above, an external resistor (such as external resistor $R_{EXT}$ 122) is located outside of the chip and is useful for providing an accurate oscillator. The external resistor $R_{EXT}$ 122 is coupled to node 120, which is a pin of the chip. In some examples, an external capacitor may be coupled in parallel to external resistor $R_{EXT}$ 122, and is configured to provide filtering for noise that occurs at node 120.

In operation, charging current generator 102 provides a charging current 156 to circuitry that produces an oscillating waveform. Amplifier 106 has a first input coupled to reference voltage node $V_{REFAMP}$ 114 and a second input coupled to node 112. Node 112 is coupled to a source of transistor 108. A gate of transistor 108 is coupled to the output of amplifier 106. Amplifier 106 ensures a reference voltage $V_{REFAMP}$ is divided by external resistor $R_{EXT}$ 122, which produces a current 154 through transistor 108. A drain of transistor 108 is coupled to current mirror 104. Current mirror 104 mirrors current 154 to produce current 156, which is a charging current for the oscillator circuitry. The current mirror 104 may have a ratio of 1:m, so current 156 is m times as large as current 154. Any number of pairs of transistors 118 may be included in current mirror 104 to produce a specific value of m.

Switches 130 are labeled either Φ1 or Φ2 indicating their switching behavior. In this example, switches 130A and 130D are Φ1, while switches 130B and 130C are Φ2. The Φ1 switches alternate opening and closing with the Φ2 switches. The switches 130 are configured to charge and discharge the capacitors 134 to produce an oscillating waveform. The opening and closing of the switches 130 produces voltages at nodes 136A and 136B. A first terminal of capacitor 134A is coupled to node 136A, which is coupled to block 138. A second terminal of capacitor 134A is coupled to ground 126. A first terminal of capacitor 134B is coupled to node 136B, which is coupled to block 138. A second terminal of capacitor 134B is coupled to ground 126.

For example, if switches 130B and 130C are closed while switches 130A and 130D are open, node 136A is shorted to ground 126 via switch 130C. Current 156 flows through switch 130B and charges capacitor 134B. Therefore, a first voltage at node 136B begins to ramp up. The first voltage at node 136B ramps up until it reaches the predetermined value of voltage $V_{REFCOMP}$ at input node 140 of block 138. Block 138 provides the inputs to comparator 144 on first input 146A and second input 146B. Block 138 selects which inputs ($V_{REFCOMP}$, 136A, 136B) to provide to comparator 144. In this example, block 138 provides the predetermined value of voltage $V_{REFCOMP}$ to first input 146A and the first voltage at node 136B to second input 146B. When the first voltage at node 136B reaches $V_{REFCOMP}$, comparator 144 toggles its outputs 148A and 148B, and the phases Φ1 and Φ2 reverse their polarity via phase generator 150. Toggling these outputs 148A and 148B activates the switches 130. For example, switches 130B and 130C open, and switches 130A and 130D close responsive to the toggling. After the toggling, the first voltage at node V136B is shorted to ground via closed switch 130D. Node 136A is coupled to current mirror 104 via closed switch 130A, and current 156 begins charging capacitor 134A through resistor $R_{ZC}$ 132A. A second voltage at node 136A begins to ramp up via the charging of capacitor 134A, and the process repeats. The second voltage ramps up until it reaches $V_{REFCOMP}$, at which time comparator 144 toggles its outputs again. This repeating process provides an oscillating clock signal.

For an external resistor oscillator with a node 120 dedicated to the external resistor $R_{EXT}$ 122, the frequency F of the oscillator is provided by Equation (1):

$$F = \frac{V_{REFAMP}}{V_{REFCOMP}} * \frac{1}{2RC} \tag{1}$$

where R is the value of external resistor $R_{EXT}$ 122 and C is the value of either capacitor 134A or 134B. If the external resistor oscillator uses a pin at node 120 that couples to external resistor $R_{EXT}$ 122 and is also shared with other circuitry, such as other subsystems 111, the frequency F of the oscillator is provided by Equation (2):

$$F = \frac{V_{REFAMP}}{V_{REFCOMP}} * \frac{1}{2RC} + \frac{I_{LEAK}}{2V_{REFCOMP}C} \tag{2}$$

The last term in Equation (2)

$$\left( e.g., \frac{I_{LEAK}}{2V_{REFCOMP}C} \right)$$

represents the undesirable voltage and temperature dependent error term caused by other subsystems 111. In examples herein, scaled leakage circuitry 132 removes or adds current $m*I_{LEAK}$ 133 from current 156, in a proportional amount compared to the current that $I_{LEAK}$ 110 removes from or adds to current 154. That is, charging current generator 102 generates current 154, and provides current 156 to oscillator circuitry 103, where current 156 is a scaled version of current 154 (e.g., scaled by m). Other subsystems 111 change the designed level of current 154 by an amount $I_{LEAK}$ 110 due to leakage of the circuit components in other subsystems 111, and therefore the designed level of current 156 is altered by $m*I_{LEAK}$ 110. Scaled leakage circuitry 132 operates to remove or add an amount of current $m*I_{LEAK}$ 110 from current 156, which is represented by current $m*I_{LEAK}$ 133. If current $m*I_{LEAK}$ 133 is removed or added appropriately, the correct designed current 156 is provided to oscillator circuitry 103.

Scaled leakage circuitry 132 does not have to completely replicate the circuitry within other subsystems 111 to replicate the current $m*I_{LEAK}$ 133. Rather, scaled leakage circuitry 132 may include a scaled version of a portion of the circuitry within other subsystems 111 that causes the leakage current $I_{LEAK}$ 110. The circuitry within scaled leakage circuitry 132 is scaled by m, which is the ratio of the current mirror 104 in an example. The scaling factor m may be any number, including 1, less than 1, or greater than 1. As an example, if the leakage current from other subsystems 111 is caused by a single diode, scaled leakage circuitry 132 may contain a scaled version of the single diode. The other components within other subsystems 111 do not need to be replicated; only the leakage path is replicated in some examples. In other examples, scaled leakage circuitry 132 may include other components to properly create the scaled leakage current $m*I_{LEAK}$ 133. In some examples, $I_{LEAK}$ 110 is modeled to determine its value, using any suitable circuit modeling techniques.

Figure 2:
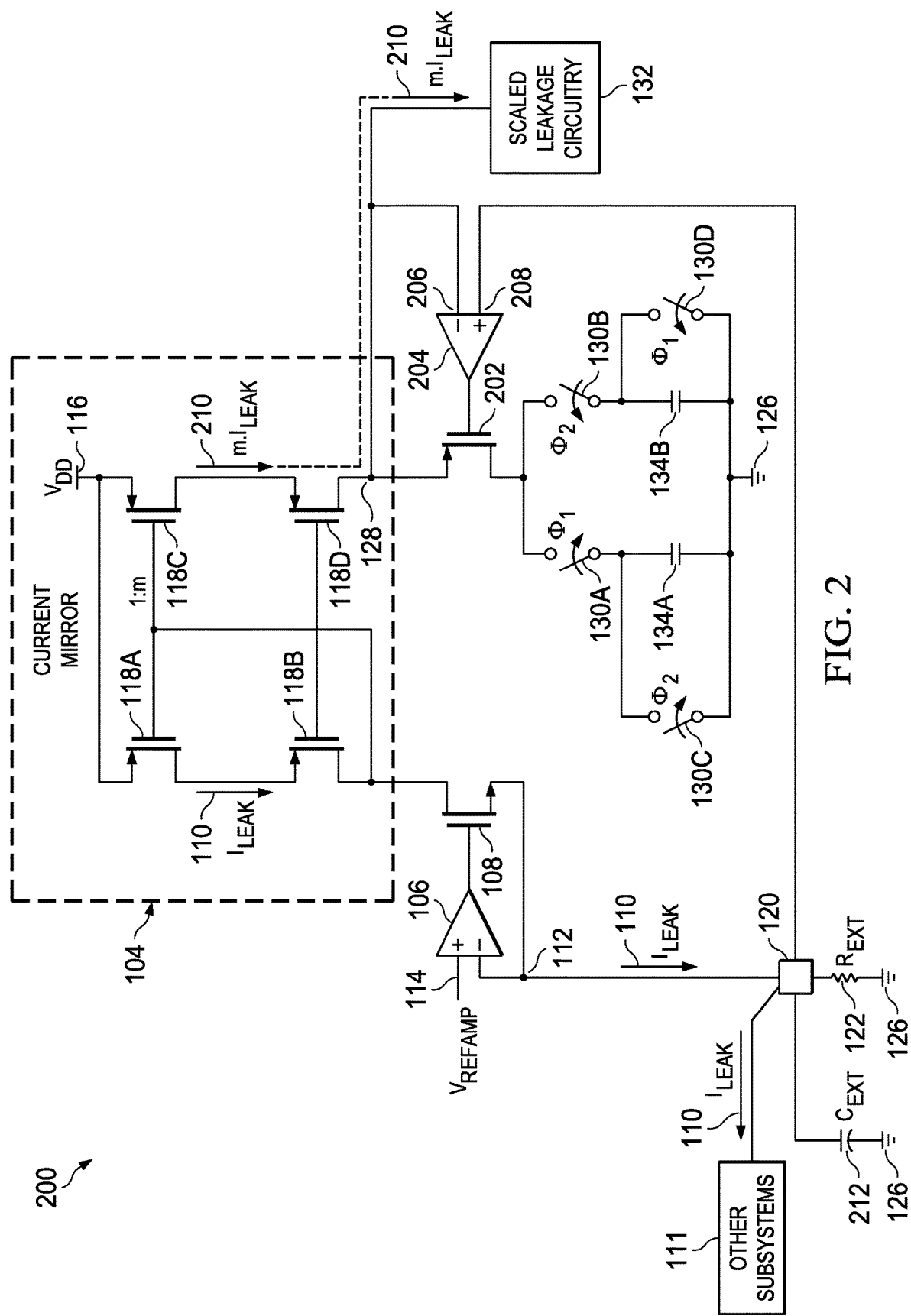
FIG. 2 is a circuit diagram of a pin-leakage compensation system for an oscillator with an external resistor in accordance with various examples.

In some examples, if the voltage at node 120 and the voltage at node 128 are different, the currents may 154 and 156 may not be scaled properly. To prevent this, it may be useful in some examples to include circuitry that replicates the voltage from node 120 at node 128 (e.g., maintains the voltage at node 128 at the same potential as the voltage at node 120). FIG. 2 provides one example to replicate this voltage.

FIG. 2 is a circuit diagram of a pin-leakage compensation system 200 for an oscillator with an external resistor in accordance with various examples herein. In FIG. 2, the same reference numbers or other reference designators are used as in FIG. 1 to designate the same or similar (functionally and/or structurally) features. The structure and operation of many of the components of system 200 are described above with respect to FIG. 1, so a detailed explanation of the components of system 200 is omitted for simplicity. Also, some components shown in FIG. 1 are omitted from FIG. 2 for simplicity, such as some components of oscillator circuitry 103 including block 138, comparator 144, and phase generator 150. System 200 includes transistor 202, amplifier 204, first amplifier input 206, second amplifier input 208, current $m*I_{LEAK}$ 210, and external capacitor $C_{EXT}$ 212. External capacitor $C_{EXT}$ 212 is coupled in parallel to external resistor $R_{EXT}$ 122, and is configured to provide filtering for noise that occurs at node 120.

Amplifier 204 includes an output coupled to a gate of transistor 202. A source of transistor 202 is coupled to node 128, and a drain of transistor 202 is coupled to switches 130A and 130B. Transistor 202 therefore is located between current mirror 104 and the components of oscillator circuitry 103 (not completely shown in FIG. 2). First amplifier input 206 is coupled to node 128, and second amplifier input 208 is coupled to node 120. Amplifier 204 provides negative feedback that maintains the voltage at node 128 to approximately the value of the voltage at node 120. Maintaining the voltage at nodes 120 and 128 to be approximately equal helps scaled leakage circuitry 132 add or subtract the proper amount of current $m*I_{LEAK}$ 210 to account for leakage current $I_{LEAK}$ 110.

Figure 3:
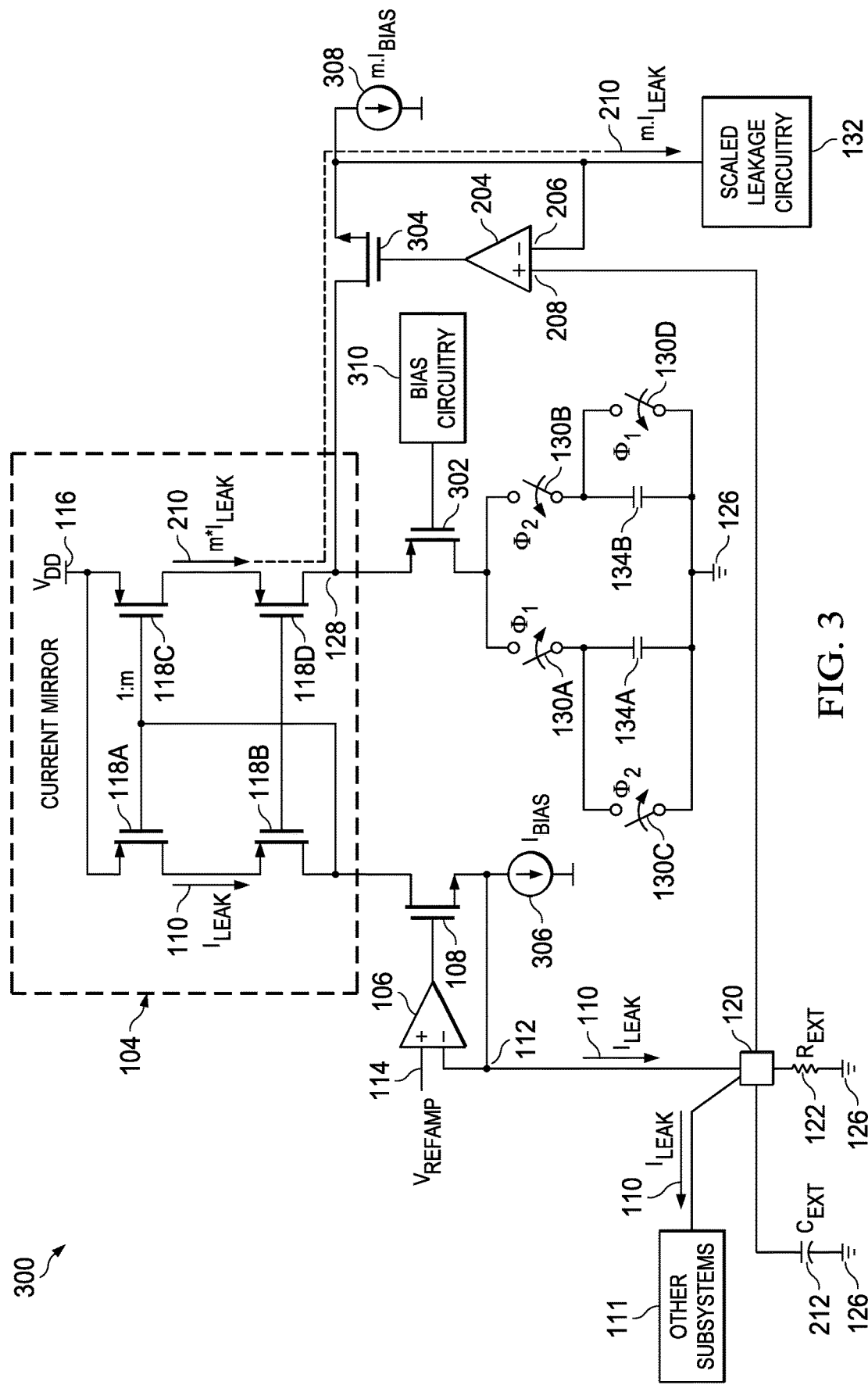
FIG. 3 is a circuit diagram of a pin-leakage compensation system for an oscillator with an external resistor in accordance with various examples.

The circuitry in system 200 may have biasing issues in some examples. Therefore, it may be useful in some examples to include additional bias circuitry for system 200. FIG. 3 provides an example of this additional bias circuitry.

FIG. 3 is a circuit diagram of a pin-leakage compensation system 300 for an oscillator with an external resistor in accordance with various examples herein. In FIG. 3, the same reference numbers or other reference designators are used as in FIGS. 1 and 2 to designate the same or similar (functionally and/or structurally) features. The structure and operation of many of the components of system 300 are described above with respect to FIGS. 1 and 2, so a detailed explanation of the components of system 300 is omitted for simplicity. Also, some components shown in FIG. 1 are omitted from FIG. 3 for simplicity, such as some components of oscillator circuitry 103 including block 138, comparator 144, and phase generator 150.

System 300 includes transistor 302, transistor 304, current source 306, current source 308, and bias circuitry 310. Current sources 306 are 308 are bias current sources that provide bias currents to components in system 300. In system 300, two transistors 302 and 304 are used to bias amplifier 204. An output of amplifier 204 is coupled to a gate of transistor 304. A source of transistor 304 is coupled to a current source 308. A drain of transistor 304 is coupled to node 128. A source of transistor 302 is coupled to node 128, while a drain of transistor 302 is coupled to switches 130. A gate of transistor 302 is coupled to bias circuitry 310, which provides appropriate bias voltage and current for transistor 302. System 300 also includes current source 306, which is coupled to a source of transistor 108 and node 120. Although not shown in FIG. 3, additional bias circuitry may also be included for transistors 118B and 118D in some examples.

Current sources 306 and 308 provide bias currents for system 300 to operate properly. Current source 306 provides a current $I_{BIAS}$ at node 120. Current source 308 provides a current $m*I_{BIAS}$ at a source of transistor 304, where m is the ratio of current mirror 104. The circuitry in system 300 isolates the source of transistor 304 and the source of transistor 302, which helps to properly bias amplifier 204.

Figure 4:
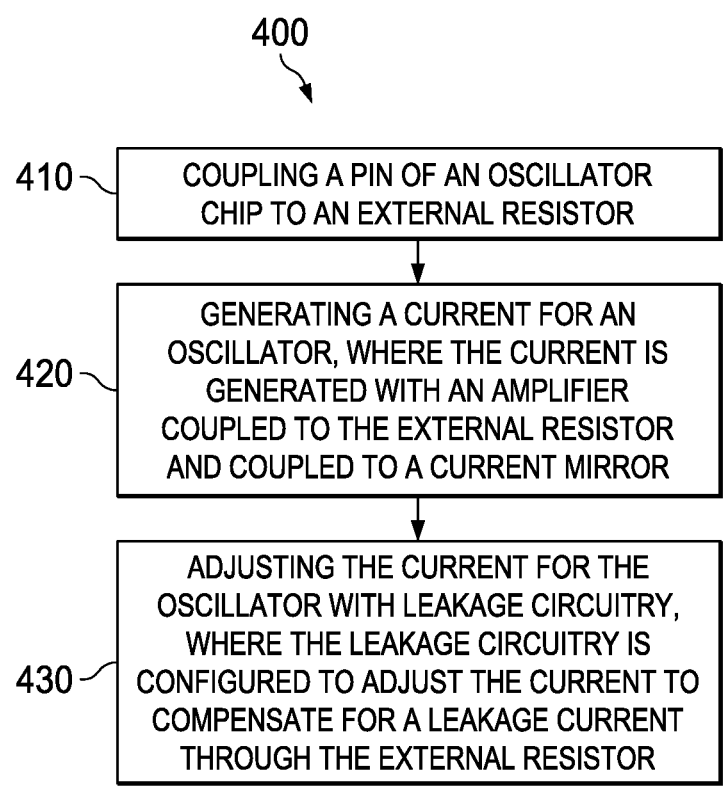
FIG. 4 is a flow diagram of a method for compensating for leakage current in an oscillating circuit in accordance with various examples.

FIG. 4 is a flow diagram of a method 400 for compensating for leakage current in an oscillating circuit in accordance with various examples herein. The steps of method 400 may be performed in any suitable order. The hardware components described above with respect to FIGS. 1-3 may perform method 400 in some examples.

Method 400 begins at 410, where a pin of an oscillator chip is coupled to an external resistor. As shown in FIG. 1, external resistor $R_{EXT}$ 122 is coupled to node 120, which represents a pin of an oscillator chip. The external resistor may provide better accuracy than an external resistor. However, in some examples the pin may be multiplexed with other functionalities that a user may use instead of the external resistor.

Method 400 continues at 420, where a current generator generates a current for an oscillator, where the current is generated with an amplifier coupled to the external resistor and coupled to a current mirror. In one example, charging current generator 102 includes amplifier 106 and current mirror 104 that operate to generate the charging current.

Method 400 continues at 430, where leakage circuitry adjusts the current for the oscillator, where the leakage circuitry is configured to adjust the current to compensate for a leakage current through the external resistor. In an example, scaled leakage circuitry 132 adjusts the current 156 provided to the oscillator circuitry 103. The scaled leakage circuitry 132 compensates for the leakage current 110 from other subsystems 111 that flows through external resistor $R_{EXT}$ 123.

In some examples, additional circuitry may be used to bias the circuitry or provide improved performance. As one example, system 200 includes an amplifier that maintains the potential at node 128 to be similar to the potential at node 120. In another example, system 300 includes an additional transistor 302 and two bias current sources 306 and 308 to bias amplifier 204 and transistor 304.

In examples herein, a leakage compensation technique cancels or compensates for the leakage current through an external resistor across voltage and temperature. The leakage current may be caused by circuitry internal to the chip that is coupled to a pin, where the external resistor is also coupled to the pin. A properly scaled copy of the leakage current is replicated with additional circuitry. This scaled leakage current is subtracted from or added to the oscillator circuitry path using the additional circuitry. Therefore, the current flowing to the oscillator switches is the designed current. The additional circuitry may replicate the leakage path, along with a scaling factor that is applied to the leakage current throughout the circuit.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A system, comprising:
   an oscillator circuit on a chip, wherein the oscillator circuit includes:
      a charging current generator including a current mirror and an amplifier, wherein the amplifier is coupled to a pin on the chip, and wherein the pin is adapted to be coupled to circuitry internal to the chip and to circuitry external to the chip;
      oscillator circuitry coupled to the charging current generator, wherein the oscillator circuitry includes a comparator, a phase generator, a first capacitor coupled to a first switch, and a second capacitor coupled to a second switch; and
      leakage circuitry coupled to the current mirror, wherein the leakage circuitry is configured to draw a current from the current mirror proportional to a leakage current flowing through the circuitry external to the chip from the circuitry internal to the chip.

2. The system of claim 1, wherein the current mirror is configured to provide a charging current to the oscillator circuitry.

3. The system of claim 1, wherein the first switch and the second switch are configured to charge and discharge the first capacitor and the second capacitor.

4. The system of claim 1, wherein the circuitry internal to the chip includes one or more multiplexed circuits.

5. The system of claim 1, wherein the leakage circuitry is a scaled replica of the circuitry internal to the chip.

6. A system, comprising:
an oscillator circuit on a chip, wherein the oscillator circuit includes:
a charging current generator including a current mirror and a first amplifier, wherein the amplifier is coupled to a pin on the chip, and wherein the pin is adapted to be coupled to circuitry internal to the chip;
oscillator circuitry coupled to the charging current generator, wherein the oscillator circuitry includes a comparator, a phase generator, a first capacitor coupled to a first switch, a second capacitor coupled to a second switch, and a second amplifier having an output, a first input, and a second input, wherein the output is coupled to a transistor, the first input is coupled to the current mirror, and the second input is coupled to the pin; and
leakage circuitry coupled to the current mirror, wherein the leakage circuitry is configured to draw a current from the current mirror proportional to a leakage current of the circuitry internal to the chip.

7. The system of claim 6, wherein the transistor has a gate coupled to the second amplifier, a source coupled to the current mirror, and a drain coupled to the first switch.

8. The system of claim 7, wherein the second amplifier is configured to maintain a voltage at the first input at a same potential as a voltage at the second input.

9. A system, comprising:
an oscillator circuit on a chip, wherein the oscillator circuit includes:
a charging current generator including a current mirror and a first amplifier, wherein the amplifier is coupled to a pin on the chip, and wherein the pin is adapted to be coupled to circuitry internal to the chip;
oscillator circuitry coupled to the charging current generator, wherein the oscillator circuitry includes a comparator, a phase generator, a first capacitor coupled to a first switch, a second capacitor coupled to a second switch, and a second amplifier having an output, a first input, and a second input, wherein the output is coupled to a transistor, the first input is coupled to a bias current source, and the second input is coupled to the pin; and
leakage circuitry coupled to the current mirror, wherein the leakage circuitry is configured to draw a current from the current mirror proportional to a leakage current of the circuitry internal to the chip.

10. The system of claim 9, wherein the transistor is a first transistor, and the oscillator circuit also includes:
a second transistor with a gate coupled to bias circuitry, a source coupled to the current mirror and to a drain of the first transistor, and a drain coupled to the first switch.

11. The system of claim 10, wherein the bias current source is a first bias current source, and the oscillator circuit includes:
a second bias current source coupled to the pin.

12. A system, comprising:
an oscillator circuit on a chip, wherein the oscillator circuit includes:
a charging current generator including a current mirror and an amplifier, wherein the amplifier is coupled to a pin on the chip, and wherein the pin is adapted to be coupled to an external resistor, wherein the external resistor is external to the chip;
oscillator circuitry coupled to the charging current generator, wherein the oscillator circuitry includes a comparator, a phase generator, a first capacitor coupled to a first switch, and a second capacitor coupled to a second switch; and
leakage circuitry coupled to the current mirror, wherein the leakage circuitry is configured to draw a current from the current mirror proportional to a leakage current flowing through the external resistor from circuitry internal to the chip.

13. The system of claim 12, wherein the circuitry internal to the chip includes one or more multiplexed circuits.

14. The system of claim 12, wherein the leakage circuitry is a scaled replica of the circuitry internal to the chip.

15. The system of claim 12, wherein the amplifier is a first amplifier, and the oscillator circuit also includes:
a second amplifier having an output, a first input, and a second input, wherein the output is coupled to a transistor, the first input is coupled to the current mirror, and the second input is coupled to the pin.

16. The system of claim 15, wherein the second amplifier is configured to maintain a voltage at the first input at a same potential as a voltage at the second input.

17. A method, comprising:
coupling a pin of an oscillator chip to an external resistor;
generating a current for an oscillator, wherein the current is generated with an amplifier coupled to the external resistor and coupled to a current mirror; and
adjusting the current for the oscillator with leakage circuitry, wherein the leakage circuitry is configured to adjust the current to compensate for a leakage current through the external resistor.

18. The method of claim 17, wherein the leakage current through the external resistor is caused by subsystem circuitry coupled to the pin.

19. The method of claim 17, wherein the amplifier is a first amplifier, and the method further comprises:
maintaining a voltage with a second amplifier, wherein the second amplifier has an output coupled to a transistor, a first input coupled to the leakage circuitry, and a second input coupled to the pin, wherein a voltage at the first input is maintained at a same potential as a voltage at the second input.

20. The method of claim 17, wherein the leakage circuitry is configured to provide a scaled adjustment to compensate for the leakage current.

* * * * *